(12) United States Patent
Hoeink et al.

(10) Patent No.: US 9,399,900 B2
(45) Date of Patent: Jul. 26, 2016

(54) ESTIMATION OF OPTIMUM TRIPPING SCHEDULES

(71) Applicants: Tobias Hoeink, Houston, TX (US); Wouter Van Der Zee, Voorburg (NL)

(72) Inventors: Tobias Hoeink, Houston, TX (US); Wouter Van Der Zee, Voorburg (NL)

(73) Assignee: BAKER HUGHES INCORPORATED, Houston, TX (US)

(*) Notice: Subject to any disclaimer, the term of this patent is extended or adjusted under 35 U.S.C. 154(b) by 382 days.

(21) Appl. No.: 13/901,277

(22) Filed: May 23, 2013

(65) Prior Publication Data

US 2014/0345945 A1    Nov. 27, 2014

(51) Int. Cl.
| | |
|---|---|
| *E21B 49/00* | (2006.01) |
| *E21B 41/00* | (2006.01) |
| *E21B 49/02* | (2006.01) |
| *E21B 25/00* | (2006.01) |

(52) U.S. Cl.
CPC ............. *E21B 41/0092* (2013.01); *E21B 25/00* (2013.01); *E21B 49/02* (2013.01)

(58) Field of Classification Search
CPC ... E21B 49/02; E21B 49/086; E21B 41/0092; E21B 25/00; E21B 44/00; G01V 99/005
USPC ..................................................... 175/50, 58
See application file for complete search history.

(56) References Cited

U.S. PATENT DOCUMENTS

| | | | |
|---|---|---|---|
| 4,996,421 | A | 2/1991 | Rai et al. |
| 2003/0168257 | A1 | 9/2003 | Aldred et al. |
| 2005/0267719 | A1 | 12/2005 | Foucault |
| 2009/0152005 | A1 | 6/2009 | Chapman et al. |
| 2011/0174543 | A1 | 7/2011 | Walkingshaw et al. |

OTHER PUBLICATIONS

M. Byrne Zubizarreta, "Pore Pressure Evolution and Core Damage: A Computational Fluid Dynamics Approach", SCA2011-41, This paper was prepared for presentation at the International Symposium of the Societ of Core Analystes held in Austin, Texas, USA Sep. 18-21, 2011, 6 pages.

M.H.H. Hettema, "Minimizing Coring-Induced Damage in Consolidated Rock", SPE/ISRM 78156, This paper was prepared for presentation at the SPE/ISRM Rock Mechanics Conference held in Irving, TX Oct. 20-23, 2012, 12 pages.

Notification of Transmittal of the International Search Report and the Written Opinion of the International Searching Authority, or the Declaration; PCT/US2014/039069; Sep. 23, 2014, 10 pages.

*Primary Examiner* — Michael Wills, III
(74) *Attorney, Agent, or Firm* — Cantor Colburn LLP

(57) ABSTRACT

A method for removing a core sample from a borehole includes: taking the core sample within the borehole with a sampling tool; generating a model of the core sample, the model based on data representing properties of the core sample; defining a plurality of proposed tripping schedules; applying, by a processor, the plurality of proposed tripping schedules to the model, and estimating a core parameter for each of the plurality of proposed tripping schedules; comparing the core parameter to a criteria; and selecting a suitable tripping schedule based on the comparison.

20 Claims, 10 Drawing Sheets

50

Swept View – Visualization Of
Homogeneous Axisymmetric
Core Model In 3D

Color Contours Represents
Pore Pressure Distribution.

50

Upper Part Of The Axisymmetric Model Domain — Post-Tripping Pore Pressure Profile

ESTIMATION OF OPTIMUM TRIPPING
SCHEDULES

BACKGROUND

In hydrocarbon exploration and energy industries, estimation of subterranean hydrocarbon reservoirs is accomplished using various techniques for measuring formation properties. Some techniques involve coring, in which rock cores from a formation are taken by drilling into a formation using a drill string that includes a core bit. During a coring operation, a rock core in the drill string is retrieved by retrieving the core via the drill string or wireline, which is referred to as "tripping." During tripping, damage to the core can occur due to decompression in the borehole, which can change various properties of the rock in the core and thus compromise results of analysis of the core at the surface. Tripping schedules should be planned that minimize core damage while allowing retrieval of the core within an acceptable time frame.

SUMMARY

An embodiment of a method for removing a core sample from a borehole includes: taking the core sample within the borehole with a sampling tool; generating a model of the core sample, the model based on data representing properties of the core sample; defining a plurality of proposed tripping schedules; applying, by a processor, the plurality of proposed tripping schedules to the model, and estimating a core parameter for each of the plurality of proposed tripping schedules; comparing the core parameter to a criteria; and selecting a suitable tripping schedule based on the comparison.

An embodiment of a system for removing a formation core sample from a borehole includes: a carrier configured to be disposed in a borehole in an earth formation, the carrier configured to receive a core sample of the formation, and a processor configured to provide a suitable tripping schedule. The processor is configured to perform: generating a model of the core sample, the model based on data representing properties of the core sample; defining a plurality of proposed tripping schedules; applying the plurality of proposed tripping schedules to the model, and estimating a core parameter for each of the plurality of proposed tripping schedules; comparing the core parameter to a criteria; and selecting the suitable tripping schedule based on the comparison.

BRIEF DESCRIPTION OF THE DRAWINGS

The following descriptions should not be considered limiting in any way. With reference to the accompanying drawings, like elements are numbered alike.

DETAILED DESCRIPTION

The systems and methods described herein provide for modeling of downhole parameters such as pore pressure to predict or estimate an optimum or suitable tripping schedule that minimizes core damage from decompression while tripping a formation core sample out of a borehole within a selected time period. An embodiment of a method includes generating a mathematical model of a formation core sample based on geometric properties of the core and core material properties such as permeability and fluid characteristics. Selected tripping schedules may be input to the model to generate predicted parameter values or curves that can be associated with potential core damage. An exemplary method includes iteratively applying multiple proposed tripping schedules to the model. A "suitable" tripping schedule is calculated by selecting one of the applied tripping schedules or iteratively adjusting one or more proposed tripping schedules until a tripping schedule having acceptable time and core damage criteria is found.

In one embodiment, the method and an associated algorithm provides an automated mechanism that derives at an optimal tripping schedule without user interference. The algorithm, in one embodiment, can be run in two modes. In a first mode, e.g., a batch mode, a plurality of proposed tripping schedules are input to the model for which a sample of model parameters is chosen, and an optimum or suitable tripping schedule is selected from the proposed tripping schedules based on results of the executed model for each proposed tripping schedule. In a second mode, also referred to as a "smart" mode, the algorithm tunes or adjusts proposed tripping schedules or subsequently inputted tripping schedules based on the output from previous model executions.

In one embodiment, maximum pore pressure differences within the core are calculated at various depths and/or times based on the model for each proposed tripping schedule. The maximum pore pressure differences are compared to pore pressure difference criteria associated with the tensile rock strength of the core material to predict core damage due to gas expansion or decompression. A tripping schedule is identified and/or calculated that is best suited to minimize core damage.

The systems and methods described herein provide for the ability to estimate whether core damage from decompression might occur for given material parameters and tripping schedules. Such systems and methods also provide for automated quantitative evaluation of tripping schedules to generate a schedule that optimizes the trade-offs between key parameters, such as permeability, tripping speed and/or duration, and tensile rock strength.

Figure 1:
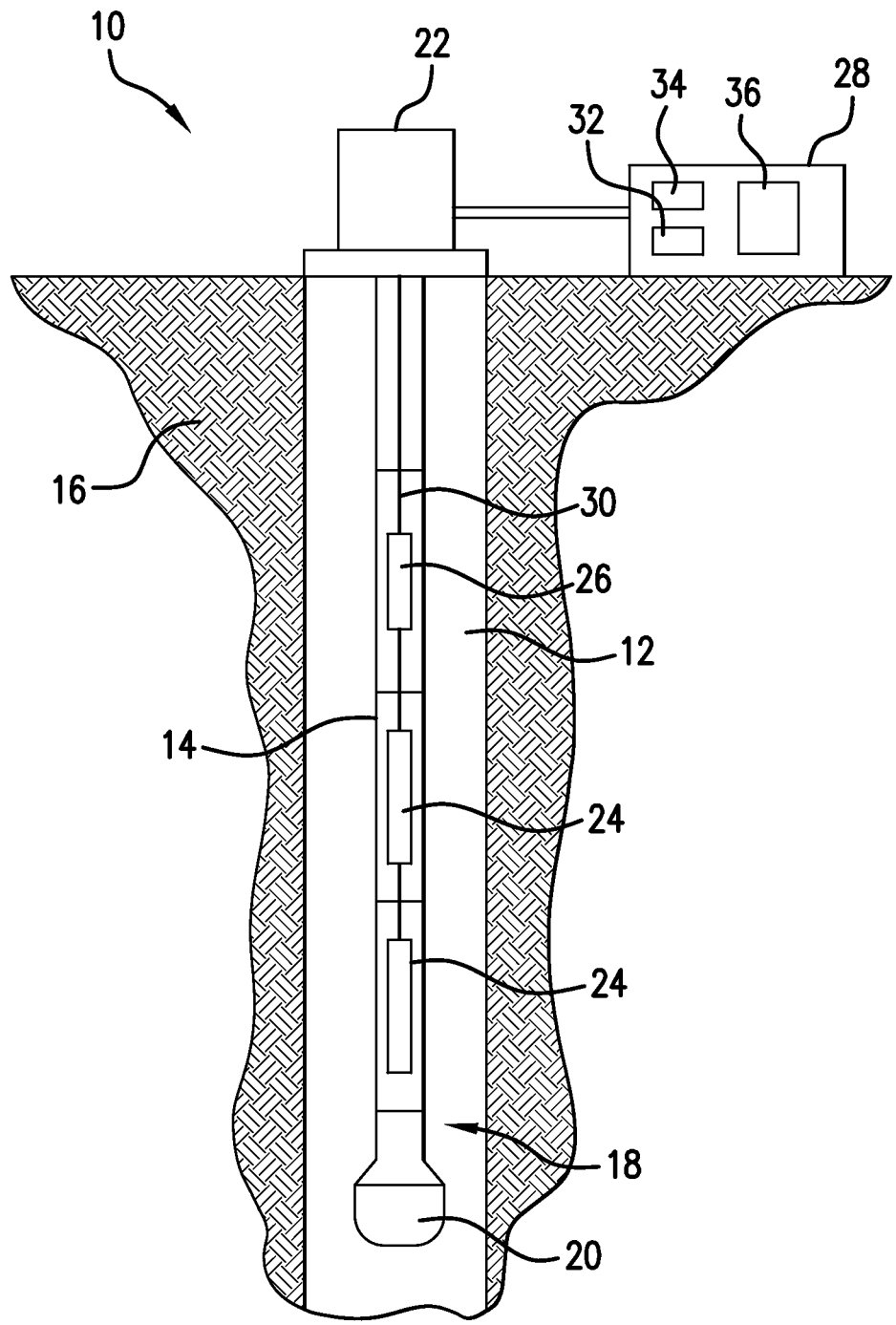
FIG. 1 is a side cross-sectional view of an embodiment of a drilling and/or geosteering system.

Referring to FIG. 1, an exemplary embodiment of a downhole drilling system 10 disposed in a borehole 12 is shown. A drill string 14 is disposed in the borehole 12, which penetrates at least one earth formation 16. Although the borehole 12 is shown in FIG. 1 to be of constant diameter, the borehole is not so limited. For example, the borehole 12 may be of varying diameter and/or direction (e.g., azimuth and inclination). The drill string 14 is made from, for example, a pipe or multiple pipe sections. The system 10 and/or the drill string 14 include a drilling assembly 18. In one embodiment, the drilling assembly is configured as a coring assembly or tool. Various measurement tools may also be incorporated into the system 10 to affect measurement regimes such as wireline measurement applications or logging-while-drilling (LWD) applications.

The drilling assembly 18, which may be configured as a bottomhole assembly (BHA), includes a drill bit 20 and is configured to be conveyed into the borehole 12 from a drilling rig 22. In one embodiment, the drilling assembly is a coring assembly configured to obtain core samples of the formation 16. The drill bit 20 in this embodiment is a coring bit incorporated as part of a coring or sampling tool. An exemplary tool includes a coring bit attached to a drill collar having an inner bore configured to receive and retain the core sample.

In one embodiment, one or more downhole components, such as the drill string 14 and the drilling assembly 18, include sensor devices 24 configured to measure various parameters of the formation and/or borehole. For example, one or more parameter sensors (or sensor assemblies such as LWD subs) are configured for formation evaluation measurements relating to the formation, borehole, geophysical characteristics and/or borehole fluids. These sensors may include formation evaluation sensors (e.g., resistivity, dielectric constant, water saturation, porosity, density and permeability), sensors for measuring geophysical parameters (e.g., acoustic velocity and acoustic travel time), and sensors for measuring borehole fluid parameters (e.g., viscosity, density, clarity, rheology, pH level, and gas, oil and water contents).

The sensor devices 24, drilling assembly 18 and other downhole components may be included in or embodied as a BHA, drill string component or other suitable carrier. A "carrier" as described herein means any device, device component, combination of devices, media and/or member that may be used to convey, house, support or otherwise facilitate the use of another device, device component, combination of devices, media and/or member. Exemplary non-limiting carriers include drill strings of the coiled tubing type, of the jointed pipe type and any combination or portion thereof. Other carrier examples include casing pipes, wirelines, wireline sondes, slickline sondes, drop shots, downhole subs, bottom-hole assemblies, and drill strings.

In one embodiment, the drilling assembly 18 and sensor devices 24 are configured to communicate with one or more processors, such as a downhole electronics unit 26 and/or a surface processing unit 28. The processor(s) may receive data and communication signals from the downhole components and/or transmit control signals to the components. Signals and data may be transmitted via any suitable transmission device or system, such as a cable 30. Other techniques used to transmit signals and data include wired pipe, electric and/or fiber optic connections, mud pulse, electromagnetic and acoustic telemetry.

The processor or processors, in one embodiment, are configured to receive data and generate information such as a mathematical model for prediction of downhole parameters and conditions. For example, the processor is configured to receive downhole data as well as additional data (e.g., from a user or database) such as geometric data of borehole components. The processor may be configured to perform functions such as providing prediction or modeling information, controlling the drilling assembly 18, transmitting and receiving data and monitoring the drilling assembly 18 and the drill string 14. The surface processing unit 28, the sensor devices 24 and/or other components may also include components as necessary to provide for storing and/or processing data collected from various sensors therein. For example, the surface processing unit 28 includes a processor 32, a data storage device (or a computer-readable medium) 34 for storing, data, models and/or computer programs or software 36.

Although the processors described herein are shown in communication with downhole components, they are not so limited. For example, a processor can be embodied as an independent computer or other processing device that can receive input data such as model parameters, measurement information and proposed tripping schedules.

Generally, some of the teachings herein are reduced to an algorithm that is stored on machine-readable media. The algorithm is implemented by a computer or processor such as the surface processing unit 28 and provides operators with desired output.

In one embodiment, a processor utilizes a quantitative (mathematical and/or numerical) method that models a formation sample core tripping out of a borehole as a permeable, elastic solid with an initial pore pressure and stress distribution, to which variable external pressures and/or loads are applied based on material parameters of the core and inputted and/or generated tripping schedules.

In one embodiment, the surface processing unit 28 or other processing device is configured to generate a model that simulates potential core damage based on inputted tripping schedules. The model may be used to estimate or select an optimum or suitable tripping schedule. A "suitable tripping schedule," in one embodiment, is a schedule that results in removal of core samples within an acceptable time frame while reducing potential core damage to an acceptable level or otherwise satisfying core damage criteria. In addition to simulating potential damage, the processing device may be configured to analyze inputted tripping schedules and select or calculate an optimum or suitable tripping schedule.

In one embodiment, the model is used to compute the external pore pressure and stress history based on proposed tripping schedules, which in turn is applied as external loads and boundary conditions. The method computes equilibration pore pressures and stresses at different points in time based on inputted tripping schedules, and predicts pore pressure differences. These are used to evaluate a rock strength criterion (e.g., but not limited to tensile rock strength) to predict potential core damage.

In one embodiment, the processing device uses an algorithm that automates an iterative process of evaluating proposed tripping schedules. For example, the algorithm applies a plurality of proposed tripping schedules (potentially a large number of tripping schedules) to predict a pool of modeled core parameters, from which the algorithm can select the optimum or suitable tripping schedule. The algorithm may further include the ability to alter proposed tripping schedules in order to narrow in on the suitable schedule.

Figure 2:
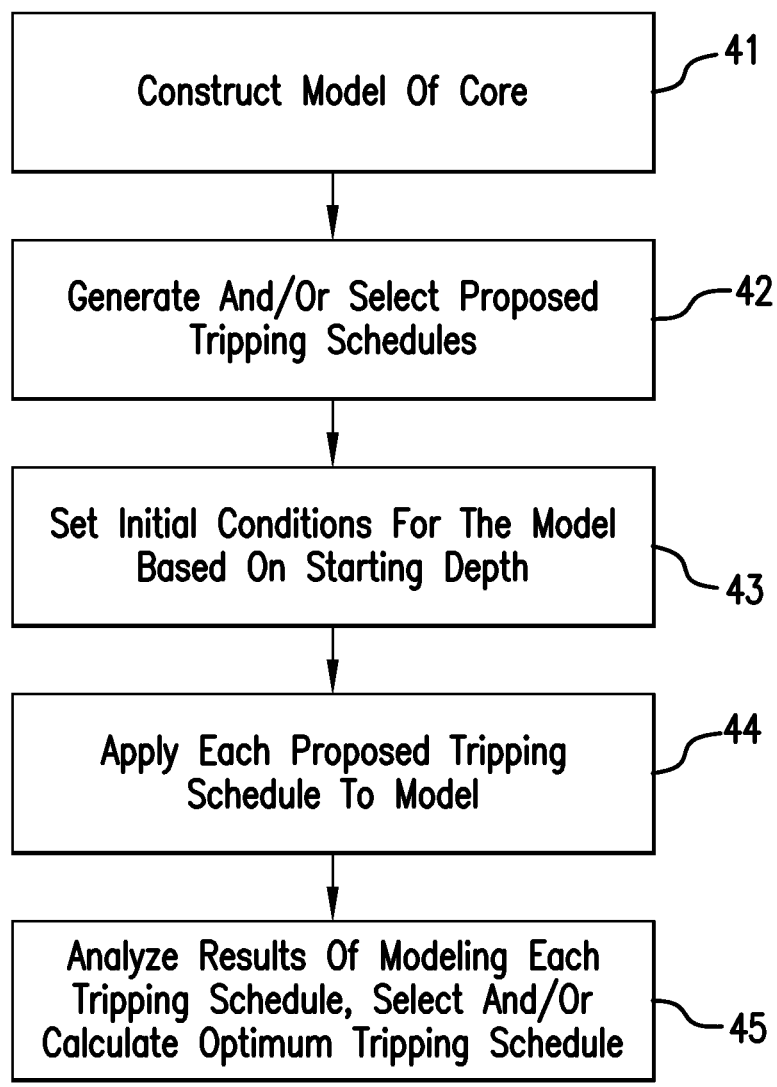
FIG. 2 is a flow chart providing an exemplary method of evaluating tripping schedules and determining a suitable tripping schedule.

FIG. 2 illustrates a method 40 for evaluating tripping schedules and determining one or more optimum or suitable tripping schedules. The method provides a quantitative prediction of a tripping schedule that minimizes damage from core decompression while tripping out of a bore hole. The method 40 includes one or more of stages 41-45 described herein, at least portions of which may be performed by a processor (e.g., the surface processing unit 28). In one embodiment, the method includes the execution of all of stages 41-45 in the order described. However, certain stages 41-45 may be omitted, stages may be added, or the order of the stages changed.

Although the systems and methods described herein relate to drill string coring, they are not so limited. For example, the systems and methods may apply to wireline coring (e.g., the coring tool of system 10 is a wireline coring/core removal tool).

In one embodiment, the method is performed as specified by an algorithm that allows a processor (e.g., the surface processing unit 28) to automatically calculate an optimum or suitable tripping schedule. The processor as described herein may be a single processor or multiple processors (e.g., a network). The algorithm output may be a single schedule or a plurality of schedules that satisfy different criteria (e.g., time or damage).

The method can be used iteratively to obtain a suitable tripping schedule. The suitable tripping schedule may be one that minimizes or avoids predicted core damage while maintaining the total tripping time to within a desired limit. Short tripping times are desired as they provide economic benefits, e.g., save time and money.

In the first stage 41, a mathematical model of a formation sample core (also referred to simply as a "core") is constructed. The model is a quantitative analytical or numerical model of a poro-elastic core that can be subjected to varying external boundary conditions and pressure loads.

Various properties of the core are selected or inputted. As described herein, "properties" of the core include any data or information used to construct the model. Such properties include, for example, geometric properties and material parameter data providing information relative to formation characteristics such as formation rock properties, other formation material properties and properties of fluid in the formation.

Geometric data related to the drill string and the core is input to generate representations of the geometry of the core. Exemplary geometric parameters include length, diameter and depth. In one embodiment, the modeled core is assumed to have a cylindrical shape, having a diameter that is much smaller than its height, although any shape could be used.

An exemplary model is generated using the finite element method. In one embodiment, multiple elements are generated from the geometric data that correspond to the shape or geometry of different portions of the core geometry. In one embodiment, the core or a portion thereof is modeled as a three-dimensional model using finite three dimensional elements.

The model is not limited to the embodiments described herein, as any mathematical model that permits prediction of pressure conditions in a simulated core may be used. In one embodiment, the model may be a mathematical/analytical model instead of a numerical model. In other embodiments, a simplified numerical model may be used, such as a two-dimensional or one-dimensional model. For example, the model may be a simplified one-dimensional diffusion model that simulates a central profile along the core's radius. Such a simplified model may be desirable as it can be solved faster, thereby allowing for a larger number of iterations or a quicker result.

Material parameters are also estimated or selected for the core. The material parameters may be based on measurements taken downhole in the current borehole in which the core is to be removed, taken from previous measurements or otherwise assumed or estimated based on knowledge of the formation. For example, the system 10 may be used to take various measurements to determine formation parameters such as permeability that can be used to generate the model.

In one embodiment, the material parameters include fluid parameters and/or formation rock parameters. Exemplary parameters include permeability, porosity, fluid density and viscosity, and rock strength.

Figure 3A:
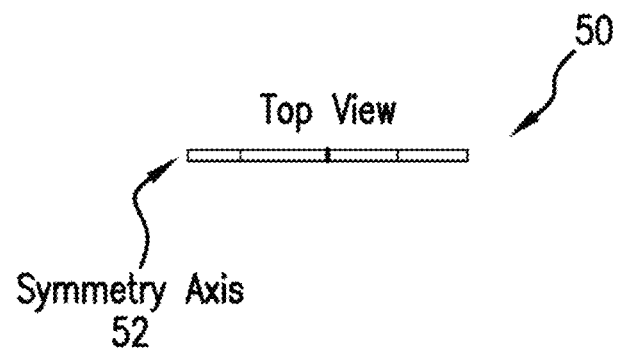
FIGS. 3A and 3B (collectively referred to herein as FIG. 3) depict an embodiment of a mathematical model of a formation core sample.
Figure 3B:
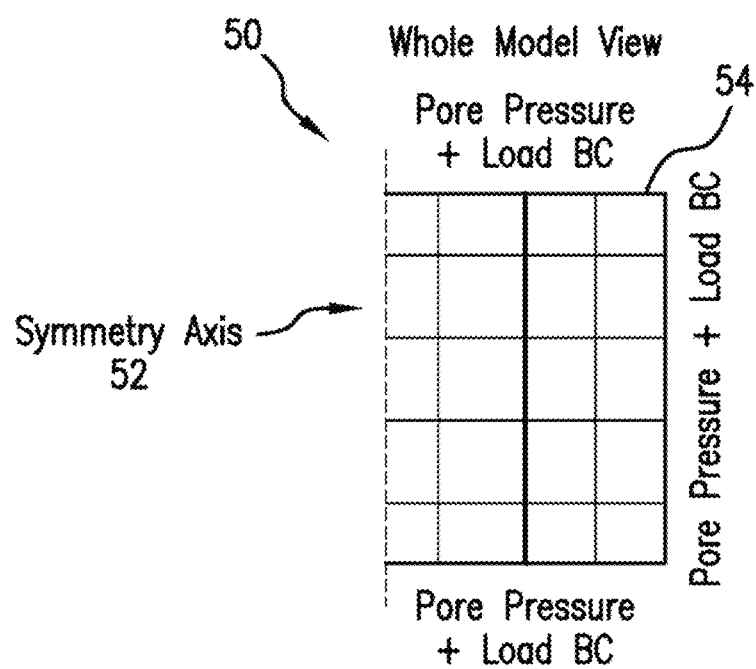
Figure 4A:
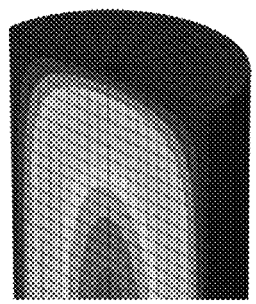
FIGS. 4A and 4B (collectively referred to herein as FIG. 4) depict an exemplary pore pressure distribution in the model of FIG. 3.
Figure 4B:
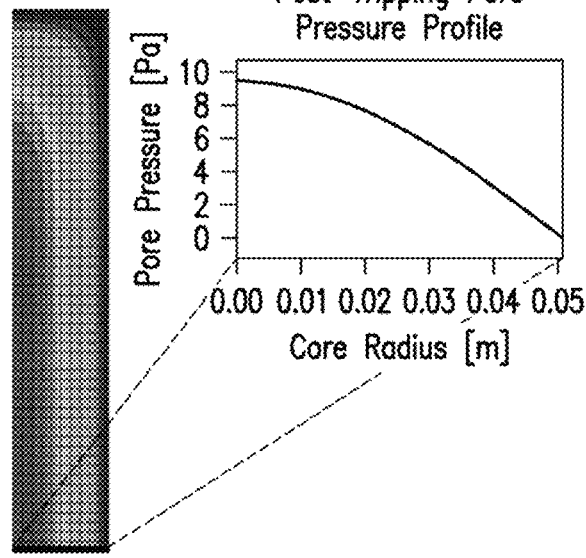

An exemplary model 50 of a core is shown in FIGS. 3 and 4. The model 50 is an axisymmetric finite-element model of a core that contains a pore fluid. As shown in FIG. 3, the model is symmetric about a symmetry axis 52 corresponding to a central axis of a coring tool. The model is subjected to boundary conditions 54 such as stress boundary conditions based on formation pore pressure and stress from the mud column.

FIG. 4 shows the upper part of an exemplary pore pressure distribution in the core, calculated by the model 50 after tripping. As shown, the pore pressure in a mid-horizontal region of the core decreases radially from the center of the core toward the boundaries of the core. In this example, the pore pressure is color coded from red (indicating higher values) to blue (indicating lower values).

In the second stage 42, tripping schedules are defined. Tripping schedules may be defined by receiving tripping schedules from a user or by generating the tripping schedules by the processor. In one embodiment, one or more proposed tripping schedules are input to the algorithm by a user. Each tripping schedule may be a linear schedule or a more complex schedule.

In one embodiment, each tripping schedule is defined by tripping velocity (or scalar equivalent being the speed) as a function of depth. For example, each tripping schedule is specified by distinct points of depth and velocity pairs. The schedule can be specified directly or constructed, e.g., by linearly interpolating between a small number of depth/velocity points or by assigning constant tripping velocities for certain depth ranges. The velocity information may be used with depth differentials to obtain tripping times, e.g., the time duration of portions of the tripping schedule and/or the entire tripping time.

In the third stage 43, initial conditions are set for the model. For example, initial values for external loads (e.g., stress) and pore-fluid pressure on the core are assigned and applied as boundary conditions to obtain an initial pore pressure distribution. The external stress and pore pressure values may be based on actual measurements, known properties of the formation and borehole, and/or depth information.

In one embodiment, the external stress and pore pressure are based on the mud weight column at the starting depth of the core, i.e., the depth of the core prior to tripping. For example, the in-situ pore pressure and the in-situ stress on the core at each depth are considered to be equal to the hydrostatic burden of drilling fluid in a borehole at that depth, given by (mud density)*g*(depth), where g is the acceleration due to gravity.

In one embodiment, a pressure amplitude is calculated for each depth. The pressure amplitude may be an amplitude of the pore pressure at a selected location of the model or the model boundary. For example, the pressure amplitude is the external pore pressure at a selected location on the core.

In the fourth stage 44, each proposed tripping schedule is applied as an input to the model to generate core parameter values as a function of time and/or depth. For each proposed tripping schedule, the external pore pressure and stress are set as boundary conditions based on the depth of elements of the simulated core during the proposed tripping schedule.

The proposed tripping schedule may be specified by distinct points or increments of depth and tripping velocity. The pore pressure distribution in the core (or other pore pressure value, such as maximum pore pressure) is calculated at each depth point in the tripping schedule based on the model. For example, as the tripping schedule proceeds from the starting depth toward the surface, at each depth point or increment, the model is subjected to successively decreasing external pressure (i.e., successively decreasing external pore-pressure and stress boundary conditions). The model incrementally adjusts the pore pressure and the stress inside the core in response to the changing boundary conditions. As a result, core parameter values in the core at each tripping schedule increment are generated. The core parameter values may be output or displayed to a user as, e.g., a core parameter curve as a function of depth or time.

In the fifth stage 45, each tripping schedule is analyzed to determine whether core damage could occur and to find a tripping schedule that minimizes core damage. At every increment or data point of the tripping schedule, the quantitative model is used to predict whether core damage from decompression might occur, e.g. by using information from the pore-pressure variable and a rock strength criterion (e.g., tensile rock strength).

The core parameter values calculated for each tripping schedule are compared to selected criteria related to potential core damage, time and/or other considerations. The time criteria may include the duration of the tripping process (e.g., the entire process or a portion thereof). Core damage criteria are related to potential core damage during tripping and/or factors that may affect the quality of the core sample. Core damage criteria may include values of any suitable properties of the core, formation and/or borehole during tripping. Such core damage criteria includes, for example, property values relating to stress, temperature, pressure, vibration, deformation and others, as well as the rate of change of such properties.

Using one or more of the criteria, a suitable tripping schedule is selected that reduces or minimizes core damage while also maximizes the overall speed of removal. The suitable tripping schedule is not so limited, as it may be selected to satisfy any selected criteria, e.g., quality, time and economic criteria.

In one embodiment, the parameter values are compared to core damage criteria at every tripping schedule point or increment to determine whether and/or how much core damage is predicted to occur at each time. The core damage criteria may include threshold parameter values associated with potential damage (or an unacceptable degree of damage). Other criteria include, for example, a duration of the tripping schedule during which core parameter values exceed a threshold and a number of data points for which core parameters values exceed a threshold. For example, the pore pressure differential calculated for each increment is compared to a selected threshold or pressure differential range associated with the tensile rock strength of the core.

In one embodiment, the proposed tripping schedule that predicts the least amount of core damage and/or meets the selected criteria is selected as the optimum or suitable tripping schedule. In one embodiment, after applying the proposed tripping schedules to the model, one or more of the proposed tripping schedules are iteratively adjusted and applied to the model until a proposed tripping schedule is considered suitable, e.g., meets core damage criteria.

Although the method 40 is described in conjunction with material parameters each having a single value, it is not so limited. For example, the method can include applying the proposed tripping schedules to multiple models of the core, each of the models having a different value for one or more material parameters selected from a range of values. The resultant core parameter values can be generated and/or displayed with an uncertainty range based on the range of material parameter values. In addition, proposed tripping schedules, revised tripping schedules and/or suitable or optimum tripping schedules can be generated and/or displayed with an uncertainty range based on the range of material parameters.

FIGS. 5-10 illustrate an example of the method 40, which is performed by a processor. In this example, the method includes constructing an axisymmetric finite-element model of a core, such as the model 50. The geometric parameters and all necessary material parameters are known or estimated. The geometric parameters of the core in this model are a core diameter of four inches and a core length of one meter. The depth of the core (i.e., the starting depth of proposed tripping schedules) is about 3,000 meters.

The material parameters selected for the model in this example are shown in the following table (Table 1). All non-scalar material parameters are assumed isotropic.

TABLE 1

| Material properties | Value |
| --- | --- |
| Permeability | $9.869 \times 10^{-21}$ m$^2$-$9.869 \times 10^{-19}$ m$^2$ |
| Fluid dynamic viscosity | $3.6 \times 10^{-7}$ m$^2$/s |
| Fluid specific weight | $10^4$ N/m$^3$ |
| Hydraulic conductivity (derived) | $2.689 \times 10^{-13}$ m/s-$2.689 \times 10^{-11}$ m/s |
| Young's modulus | 9 GPa |
| Poisson's ratio | 0.2 |
| Density | $2 \times 10^3$ kg/m$^3$ |
| Porosity (void ratio) | 0.15 |
| Drilling fluid density | $1.6 \times 10^3$ kg/m$^3$ |
| Fluid bulk modulus | 1 GPa |
| Rock bulk modulus | 5 GPa |
| Tensile rock strength | 3 MPa |

Although most material parameters shown above have a single value, the method is not so limited. In one embodiment, multiple models are generated, each having a different material parameter value, and proposed tripping schedules are applied to each model. The output of the method may include optimum or suitable tripping schedules for each model and/or an optimum or suitable tripping schedule having an uncertainty range based on the range of material parameter values. For example, the proposed tripping schedules are applied to models having different values for permeability (e.g., permeability values of 0.0001, 0.001 and 0.01 mDarcy).

Figure 5:
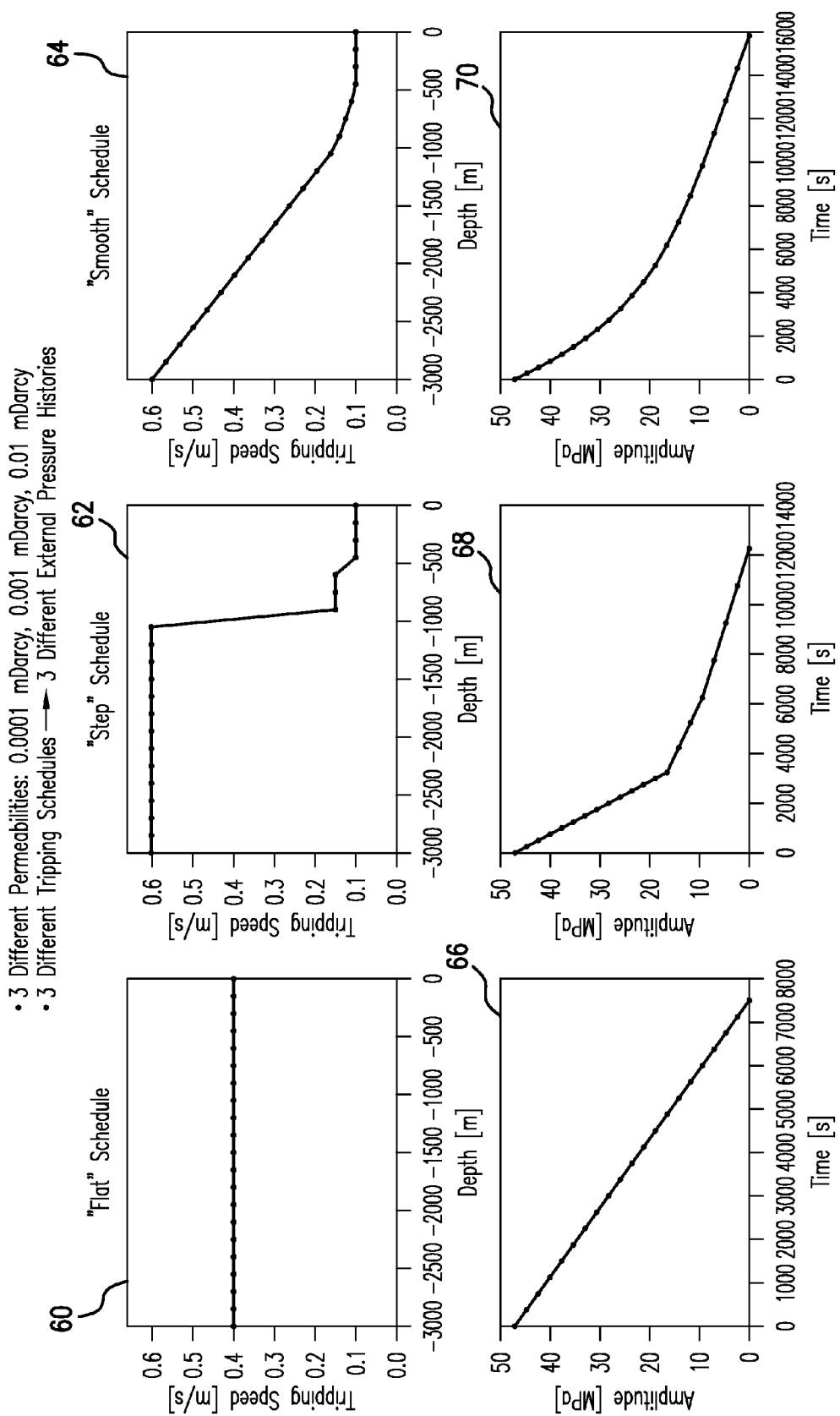
FIG. 5 depicts exemplary proposed tripping schedules selected for application to a mathematical model of a formation core sample.

FIG. 5 shows exemplary proposed tripping schedules selected for application to the model. The tripping schedules are displayed as tripping speed as a function of depth. A first proposed tripping schedule 60 prescribes a constant tripping speed, and is described as a "flat" schedule. A second proposed tripping schedule 62 is a "step" schedule prescribing three constant tripping speeds, and a third proposed tripping schedule 64 is a "smooth" schedule that prescribes a more gradually decreasing tripping speed relative to depth.

The tripping speed and depth is used to correlate each depth with a time value, and an amplitude of pressure on the core is calculated at each depth of the core. In this example, the pressure amplitude is calculated based on the mud weight at each depth. Pressure amplitude curves 66, 68 and 70 are calculated for the flat schedule 60, the step schedule 62 and the smooth schedule 64 respectively. The pressure amplitude at each time is used to calculate the external boundary condition and load on the model at the corresponding tripping schedule increment.

For each proposed tripping schedule, pore pressure evolution in the core is calculated using the model. The minimum and maximum pore pressure in the core is calculated, and a pressure differential is calculated therefrom. The processor stores, among other information, the minimum and maximum pore pressure at each time increment.

Figure 6:
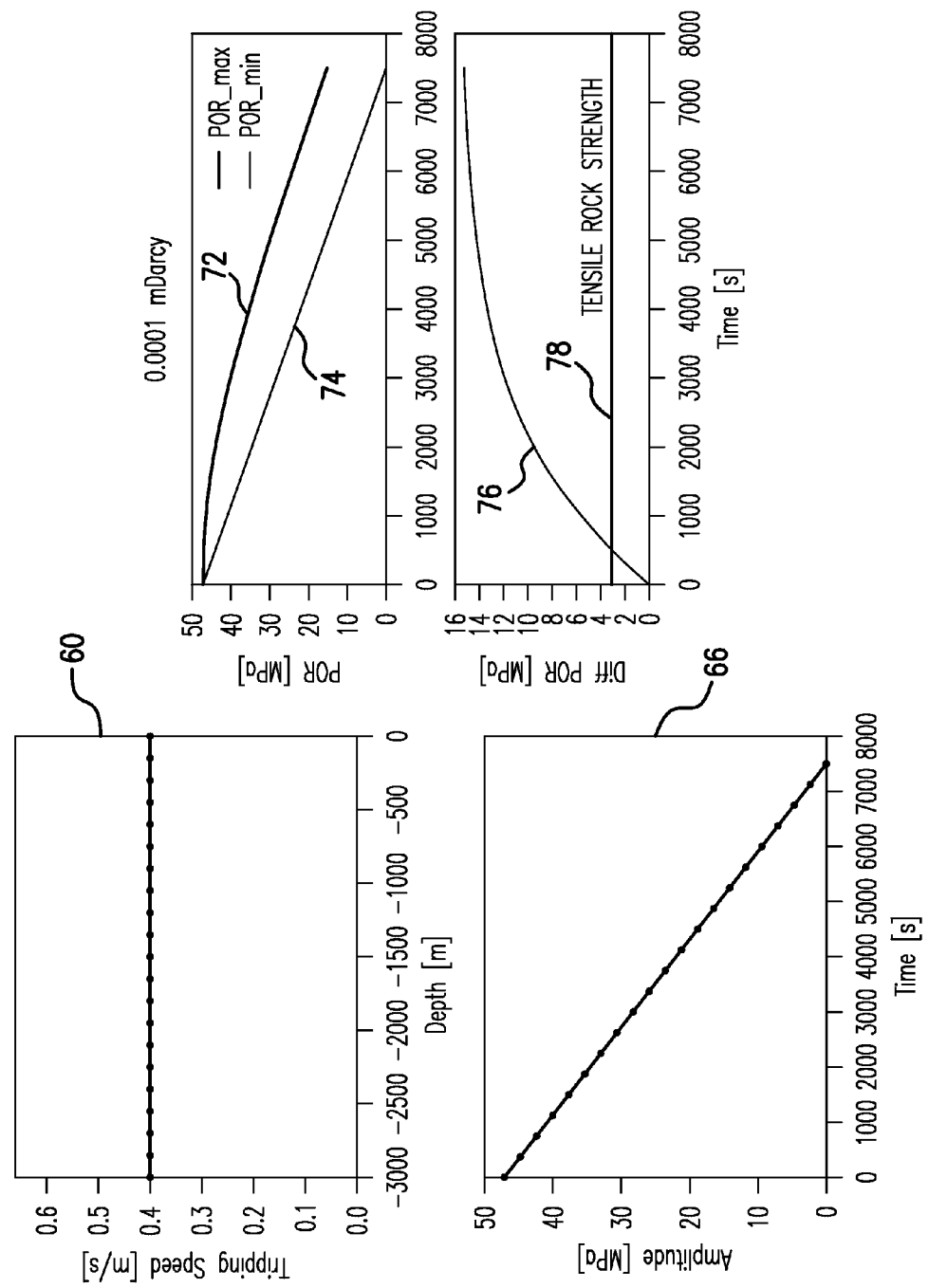
FIG. 6 depicts a proposed tripping schedule of FIG. 5 and core parameters resulting from application of the proposed tripping schedule to the model.
Figure 7:
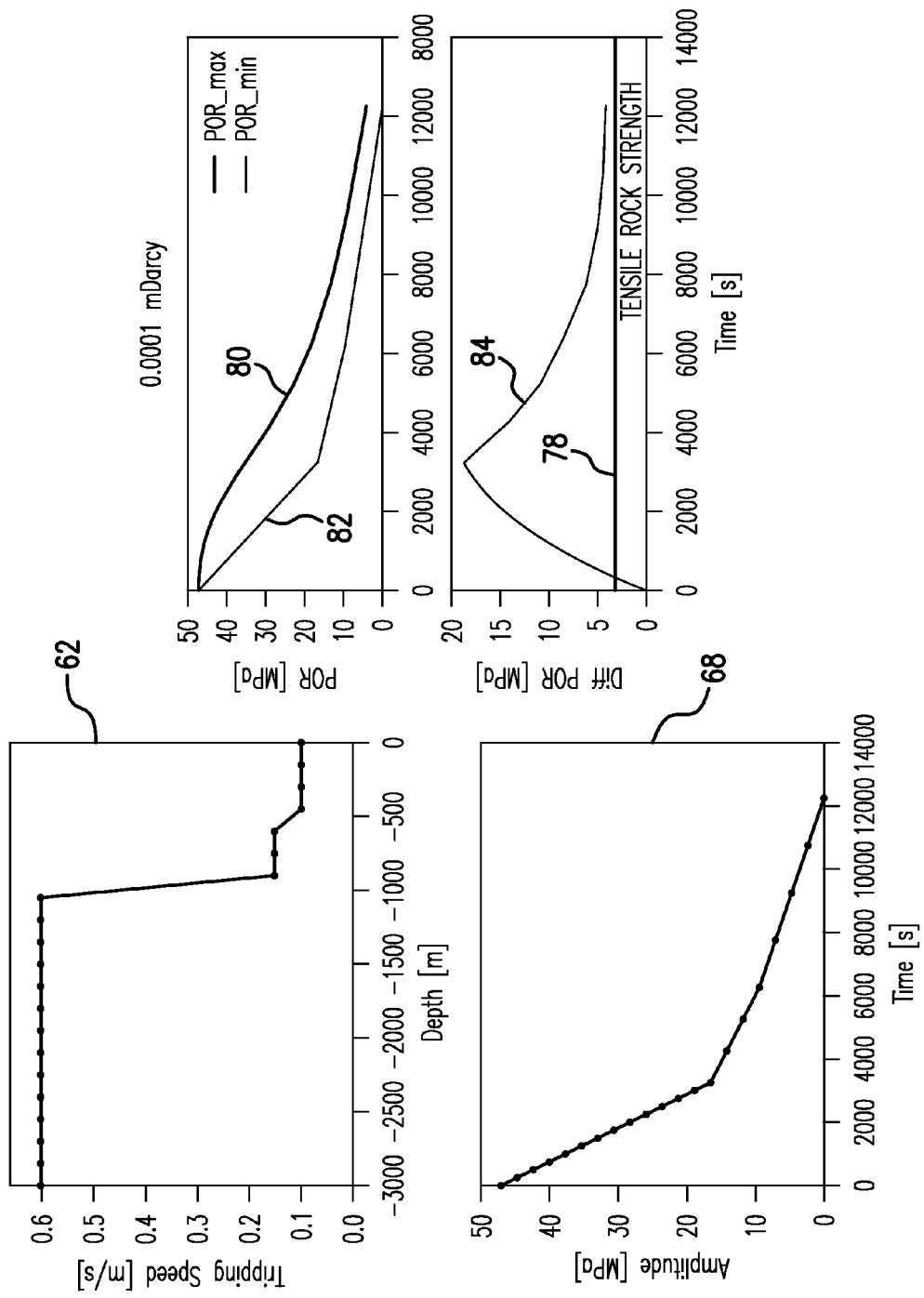
FIG. 7 depicts a proposed tripping schedule of FIG. 5 and core parameters resulting from application of the proposed tripping schedule to the model.
Figure 8:
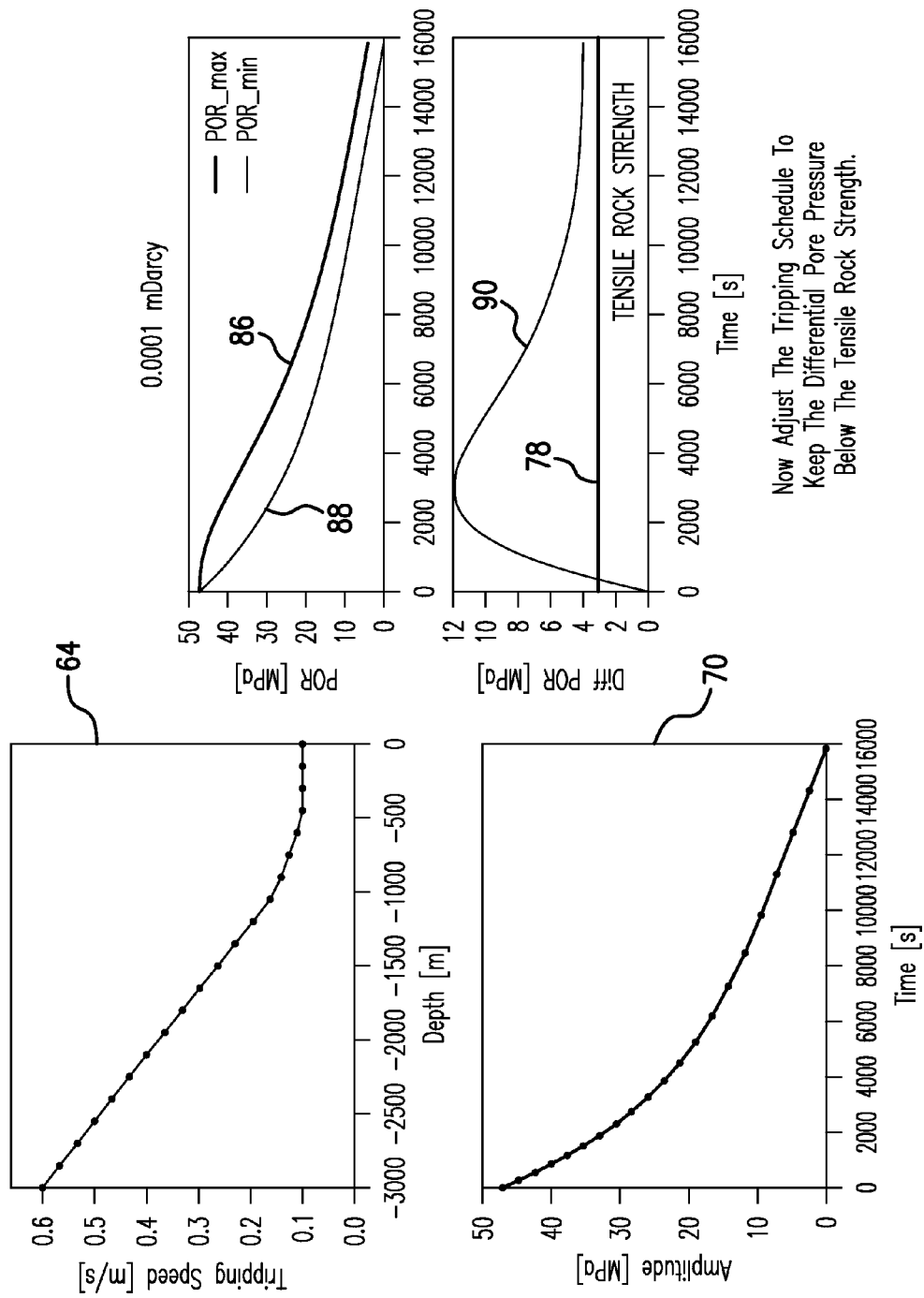
FIG. 8 depicts a proposed tripping schedule of FIG. 5 and core parameters resulting from application of the proposed tripping schedule to the model.

FIGS. 6-8 illustrate the resultant pore pressure parameter values for each proposed tripping schedule as curves representing the maximum and minimum pore pressure in the core (e.g., maximum at center and minimum at or near edge or boundary) and the pore pressure differential. The resultant values for the proposed tripping scheduled may be stored and/or displayed to a user.

Each proposed tripping schedule is compared to selected damage criteria to determine whether any meet the criteria. In this example, the calculated pore pressure parameters are compared to threshold values indicative of core damage, to determine whether the proposed tripping schedules potentially cause core damage.

In the present example, the calculated differential pressure values are compared to a differential pressure threshold of about 3 MPa, which is associated with an unacceptable level of core damage.

As shown in FIG. 6, the proposed flat schedule 60 results in a maximum pore pressure curve 72, a minimum pore pressure curve 74 and a differential pressure curve 76. It is evident that the proposed flat schedule 60 results in a differential pressure that exceeds a threshold value 78 associated with the tensile rock strength over most of the duration of the proposed tripping.

As shown in FIG. 7, the proposed step schedule 62 results in a maximum pore pressure curve 80, a minimum pore pressure curve 82 and a differential pressure curve 84. As shown in FIG. 8, the proposed smooth schedule 64 results in a maximum pore pressure curve 86, a minimum pore pressure curve 88 and a differential pressure curve 90. Both the proposed step schedule and smooth schedule exceed the threshold over portions thereof.

As none of the proposed tripping schedule meet the core damage criteria, the processor proceeds to analyze additional proposed schedules if provided until a schedule that meets the criteria is found. Alternatively, if none is found, the processor may present to a user one or more of the proposed tripping schedules that are predicted to result in the lowest damage. In one embodiment, the results of the analysis for one or more of the tripping schedules is displayed to a user, who may input additional proposed tripping schedules.

Figure 9:
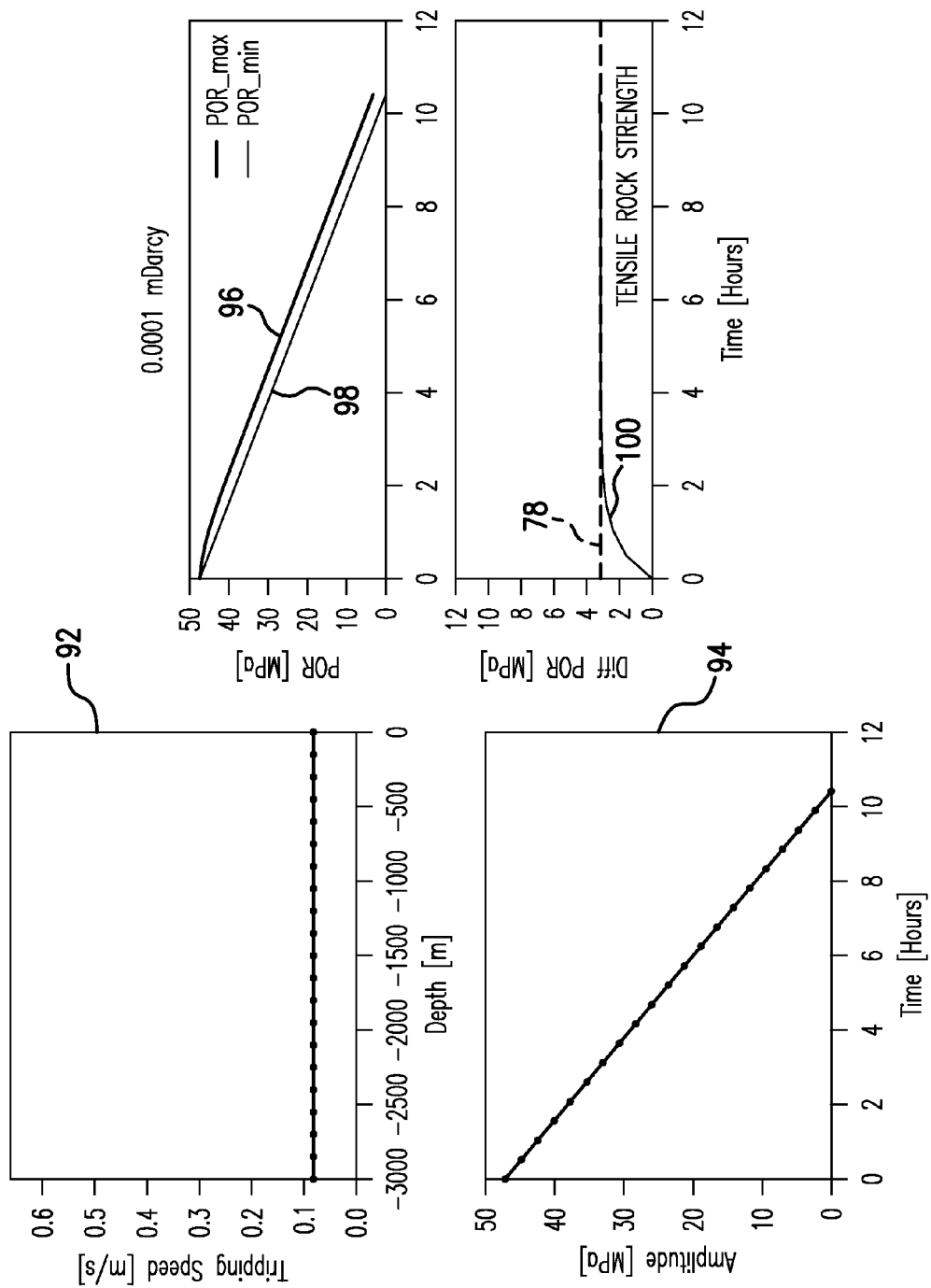
FIG. 9 depicts a revised tripping schedule generated based on application of a proposed tripping schedule of FIG. 5 to the model.
Figure 10:
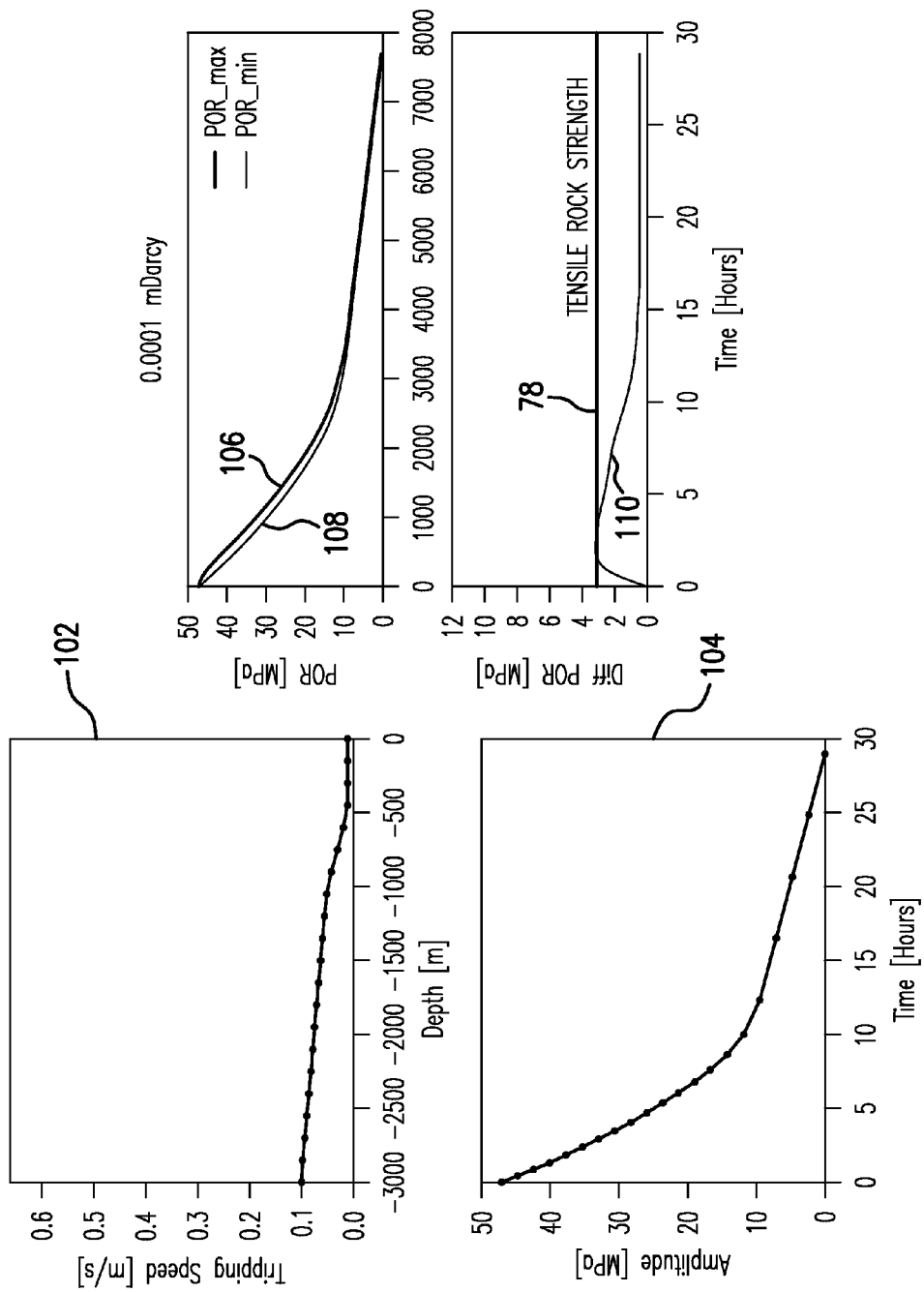
FIG. 10 depicts a revised tripping schedule generated based on application of a proposed tripping schedule of FIG. 5 to the model.

In one embodiment, shown in FIGS. 9-10, the processor iteratively adjusts one or more of the proposed tripping schedules until an acceptable tripping schedule is found. For example, as shown in FIG. 9, the flat schedule is adjusted to produce a first revised schedule 92, which is associated with a pressure amplitude curve 94. Application of this schedule to the model produces a maximum pore pressure curve 96, a minimum pore pressure curve 98 and a pore pressure differential curve 100. As shown in FIG. 9, the differential pore pressure is maintained at about the threshold level.

Referring to FIG. 10, the processor further adjusts the revised schedule 92 to produce a second revised schedule 102 having an associated amplitude curve 104. Application of this schedule to the model produces a maximum pore pressure curve 106, a minimum pore pressure curve 108 and a pore pressure differential curve 110. This revised schedule may be selected as the optimum or suitable schedule, or further revised (e.g., to further reduce the total tripping time while maintaining the differential pore pressure below threshold levels).

In addition to effects of pressure release while tripping out, additional mechanisms may affect core integrity and lead to core damage. Such mechanism include the effect of a mud cake, in-situ stress orientations, external stress release during drill out, temperature reduction and exposure to non-native fluids. The method described herein may be used in conjunction with other techniques or methods that account for such mechanisms in evaluating tripping schedules and ensuring acceptable or maximum core integrity.

The systems and methods described herein provide various advantages over prior art techniques. For example, the systems and methods allow for automated selection and/or generation of a tripping schedule for removal of a formation core sample that results in minimal or reduced core damage without requiring user intervention. The systems and methods described herein help to ensure that core samples can be removed as quickly as possible without breaking or otherwise being significantly damaged.

In support of the teachings herein, various analyses and/or analytical components may be used, including digital and/or analog systems. The system may have components such as a processor, storage media, memory, input, output, communications link (wired, wireless, pulsed mud, optical or other), user interfaces, software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

One skilled in the art will recognize that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for removing a core sample from a borehole, the method comprising:
   taking the core sample within the borehole with a sampling tool;
   generating a model of the core sample, the model based on data representing properties of the core sample;
   defining a plurality of proposed tripping schedules;
   applying, by a processor, the plurality of proposed tripping schedules to the model, and estimating a core parameter for each of the plurality of proposed tripping schedules;
   comparing the core parameter to a criteria; and selecting a suitable tripping schedule based on the comparison.

2. The method of claim 1, wherein selecting the suitable tripping schedule includes selecting a tripping schedule from the plurality of proposed tripping schedules that results in a minimum potential core damage.

3. The method of claim 1, wherein selecting the suitable tripping schedule includes iteratively revising one or more of the plurality of proposed tripping schedules by the processor until a revised tripping schedule is found that meets the criteria.

4. The method of claim 1, wherein the criteria includes at least one of a core damage criteria and a maximum total tripping time.

5. The method of claim 1, wherein the model is selected from one of a numerical model and an analytical model.

6. The method of claim 1, wherein the model is a finite-element model of the core sample, and applying the plurality of proposed tripping schedules to the model includes, for each proposed tripping schedule, applying a boundary condition to the model at each increment of the proposed tripping schedule based on a depth of the core sample at each increment.

7. The method of claim 6, wherein the core parameter includes a differential pore pressure in the core sample, and the boundary condition is based on external stress and pore pressure incident on the core sample at each increment.

8. The method of claim 7, further comprising calculating a pressure amplitude curve associated with the proposed tripping schedule, the pressure amplitude curve having an external pressure value based on a depth of the core sample at each increment.

9. The method of claim 8, wherein the boundary condition at each increment is based on a value of the pressure amplitude curve at each increment.

10. The method of claim 1, wherein comparing includes comparing the core parameter to one or more threshold values, and at least one of selecting one of the plurality of proposed schedules and adjusting one of the plurality of proposed schedules based on the comparison.

11. The method of claim 7, wherein applying the plurality of proposed tripping schedules includes, for each proposed tripping schedule:
    setting initial stress and pore pressure conditions for the model based on a starting depth of the proposed tripping schedule, and applying the initial stress and pore pressure conditions as boundary conditions to calculate a pore pressure value in the core sample at the starting depth; and
    setting successive stress and pore pressure conditions for each increment of the proposed tripping schedule and applying the successive stress and pore pressure conditions as boundary conditions for each increment to generate a pore pressure value in the core sample at each increment.

12. A system for removing a core sample from a borehole, the system comprising:
    a carrier configured to transport the core sample through part of the borehole; and
    a processor configured to provide a suitable tripping schedule, the processor configured to perform:
    generating a model of the core sample, the model based on data representing properties of the core sample;
    defining a plurality of proposed tripping schedules;
    applying the plurality of proposed tripping schedules to the model, and estimating a core parameter for each of the plurality of proposed tripping schedules;
    comparing the core parameter to a criteria; and
    selecting the suitable tripping schedule based on the comparison.

13. The system of claim 12, wherein selecting the suitable tripping schedule includes selecting a proposed tripping schedule from the plurality of proposed tripping schedules that results in a minimum potential core damage.

14. The system of claim 12, wherein selecting the suitable tripping schedule includes iteratively revising one or more of the plurality of proposed tripping schedules until a revised tripping schedule is found that meets the criteria.

15. The system of claim 12, wherein the model is a finite-element model of the core sample, and applying the plurality of proposed tripping schedules to the model includes, for each proposed tripping schedule, applying a boundary condition to the model at each increment of the proposed tripping schedule based on a depth of the core sample at each increment.

16. The system of claim 15, wherein the core parameter includes a differential pore pressure in the core sample, and the boundary condition is based on external stress and pore pressure incident on the core sample at each increment.

17. The system of claim 16, wherein the processor is further configured to perform calculating a pressure amplitude curve associated with the proposed tripping schedule, the pressure amplitude curve having an external pressure value based on a depth of the core sample at each increment.

18. The system of claim 17, wherein the boundary condition at each increment is based on a value of the pressure amplitude curve at each increment.

19. The system of claim 12, wherein comparing includes comparing the core parameter to one or more threshold values, and at least one of selecting one of the plurality of proposed schedules and adjusting one of the plurality of proposed schedules based on the comparison.

20. The system of claim 15, wherein applying the plurality of proposed tripping schedules includes, for each proposed tripping schedule:
    setting initial stress and pore pressure conditions for the model based on a starting depth of the proposed tripping schedule, and applying the initial stress and pore pressure conditions as boundary conditions to calculate a pore pressure value in the core sample at the starting depth; and
    setting successive stress and pore pressure conditions for each increment of the proposed tripping schedule and applying the successive stress and pore pressure conditions as boundary conditions for each increment to generate a pore pressure value in the core sample at each increment.

* * * * *